(12) United States Patent
Zhou et al.

(10) Patent No.: US 11,114,469 B2
(45) Date of Patent: Sep. 7, 2021

(54) ARRAY SUBSTRATE AND FABRICATING METHOD THEREOF, DISPLAY PANEL AND DISPLAY DEVICE

(71) Applicant: BOE TECHNOLOGY GROUP CO., LTD., Beijing (CN)

(72) Inventors: Bin Zhou, Beijing (CN); Binbin Cao, Beijing (CN); Liangchen Yan, Beijing (CN); Dongfang Wang, Beijing (CN); Ce Zhao, Beijing (CN); Luke Ding, Beijing (CN); Jun Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/396,726

(22) Filed: Apr. 28, 2019

(65) Prior Publication Data
US 2020/0035716 A1    Jan. 30, 2020

(30) Foreign Application Priority Data
Jul. 27, 2018   (CN) .......................... 201810844123.1

(51) Int. Cl.
*H01L 27/12*    (2006.01)

(52) U.S. Cl.
CPC ........ *H01L 27/1225* (2013.01); *H01L 27/124* (2013.01); *H01L 27/127* (2013.01)

(58) Field of Classification Search
CPC .. H01L 27/1225; H01L 27/124; H01L 27/127
See application file for complete search history.

(56) References Cited

U.S. PATENT DOCUMENTS

| | | | | |
|---|---|---|---|---|
| 5,124,769 A | * | 6/1992 | Tanaka | H01L 29/7831 257/66 |
| 5,250,835 A | * | 10/1993 | Izawa | H01L 27/0922 257/344 |
| 5,658,808 A | * | 8/1997 | Lin | H01L 29/6675 257/E21.412 |
| 6,184,559 B1 | * | 2/2001 | Hayakawa | G02F 1/1368 257/365 |
| 7,008,831 B2 | * | 3/2006 | Sasaki | H01L 21/28105 257/344 |
| 7,943,935 B2 | * | 5/2011 | Ishiguro | H01L 29/42384 257/66 |
| 7,964,455 B2 | * | 6/2011 | Yamauchi | H01L 21/266 438/155 |
| 2002/0158269 A1 | * | 10/2002 | Lui | H01L 29/78612 257/200 |

(Continued)

*Primary Examiner* — Eugene Lee
(74) *Attorney, Agent, or Firm* — Thomas | Horstemeyer, LLP

(57) ABSTRACT

The present disclosure is in the field of display technologies, and provides an array substrate including an IGZO film layer, a gate layer, and a gate insulating layer. The gate layer is provided with broken lines at a position thereof overlapping the IGZO film layer to form a first gate line and a second gate line. The gate insulating layer is disposed between the IGZO film layer and the gate layer, and is provided with at least two through holes thereon, in which the first gate line is connected with the IGZO film layer through one of the through holes, and the second gate line is connected with the IGZO film layer through another through hole, thus, connecting the IGZO film layer in series into the gate layer.

12 Claims, 2 Drawing Sheets

(56) References Cited

U.S. PATENT DOCUMENTS

2009/0261337 A1* 10/2009 Sakakura .......... H01L 29/78645
257/72
2016/0209719 A1* 7/2016 Yamaguchi ....... G02F 1/136227
2018/0358386 A1* 12/2018 Choo .................. H01L 21/3212

* cited by examiner

ARRAY SUBSTRATE AND FABRICATING METHOD THEREOF, DISPLAY PANEL AND DISPLAY DEVICE

CROSS-REFERENCE TO RELATED APPLICATIONS

The present application is based on, and claims the benefit of and priority to, Chinese Patent Application No. 201810844123.1, filed on Jul. 27, 2018, the entire contents of which being incorporated herein by reference.

TECHNICAL FIELD

The present disclosure relates to the field of display technologies, and in particular, to an array substrate and a fabricating method thereof, a display panel on which the array substrate is installed, and a display device on which the display panel is installed.

BACKGROUND

In the technology of OLED TV, the top gate type thin film transistor realizes a narrow channel, which makes the thin film transistor smaller in volume, thereby increasing the aperture ratio and improving the image quality. However, in each pixel, the amorphous silicon thin film transistor will occupy a certain area of the pixel so that the light transmission area is reduced. The thin film transistor formed of indium gallium zinc oxide is transparent and insensitive to visible light, which greatly increases the aperture ratio of the device so as to increase brightness and reduce power consumption.

At present, due to the instability of the conductorizing process of indium gallium zinc oxide, poor conductorization is likely to occur. The conductorizing process of indium gallium zinc oxide determines a connection resistance of the source/drain electrode and indium gallium zinc oxide, and the connection resistance determines a product pass rate. However, such a poor conductorization cannot be detected by an optical device and can only be tested after all of processes are completed. Therefore, it is necessary to carry out subsequent processes for a product having poor conductorization, which wastes manpower and physical resources, and causes a decrease in the product pass rate.

Therefore, there is a need to study a new array substrate and a fabricating method thereof, a display panel on which the array substrate is installed, and a display device on which the display panel is installed.

The above information disclosed in the background is only intended to enhance understanding of the background of the present disclosure, and thus may include information that does not constitute a related art known to those of ordinary skill in the art.

SUMMARY

An objective of the present disclosure is to overcome the deficiency that poor conductorization of indium gallium zinc oxide could only be tested after all of processes are completed in the above-described related art, and provides an array substrate capable of detecting indium gallium zinc oxide with poor conductorization in advance, and a fabricating method thereof, a display panel on which the array substrate is installed, and a display device on which the display panel is installed.

The additional aspects and advantages of the present disclosure will be set forth in part in the following description, and will partially be apparent from the description, or may be learned by practice of the present disclosure.

According to an aspect of the present disclosure, there is provided an array substrate, including:

an IGZO film layer;

a gate layer provided with broken lines at a position thereof overlapping the IGZO film layer to form a first gate line and a second gate line;

a gate insulating layer disposed between the IGZO film layer and the gate layer, and provided with at least two through holes thereon, in which the first gate line is connected with the IGZO film layer through at least one through hole, and the second gate line is connected with the IGZO film layer through another at least one through hole.

In an example embodiment of the present disclosure, the IGZO film layer is disposed under the gate insulating layer, and the gate layer is disposed over the gate insulating layer.

In an example embodiment of the present disclosure, the array substrate further includes:

a substrate;

a light shielding layer disposed over the substrate;

a buffer layer disposed over the light shielding layer and the substrate, the IGZO film layer being disposed on the buffer layer;

an interlayer insulating layer disposed over the gate layer and the buffer layer;

a source/drain layer disposed over the interlayer insulating layer;

a passivation layer disposed over the source/drain layer;

a pixel electrode layer disposed over the passivation layer.

In an example embodiment of the present disclosure, the IGZO film layer is disposed over the gate insulating layer, and the gate layer is disposed under the gate insulating layer.

According to an aspect of the present disclosure, there is provided a fabricating method of an array substrate, including:

forming an IGZO film layer;

forming a gate insulating layer over the IGZO film layer and forming at least two through holes on the gate insulating layer;

forming a gate layer over the gate insulating layer, and providing broken lines at a position of the gate layer overlapping the IGZO film layer to form a first gate line and a second gate line, in which the first gate line is connected with the IGZO film layer through at least one through hole, and the second gate line is connected with the IGZO film layer through another at least one through hole.

In an example embodiment of the present disclosure, after the at least two through holes are formed on the gate insulating layer, the fabricating method further includes:

conductorizing the IGZO film layer.

According to an aspect of the present disclosure, a fabricating method of an array substrate is provided, including:

forming a gate layer, and etching the gate layer to provide broken lines so as to form a first gate line and a second gate line;

forming a gate insulating layer over the gate layer, and forming, on the gate insulating layer, at least one first through hole communicated to the first gate line and at least one second through hole communicated to the second gate line;

forming an IGZO film layer over the gate insulating layer, the IGZO film layer being connected with the gate layer through the at least one first through hole and the at least one second through hole.

In an exemplary embodiment of the present disclosure, the fabricating method further includes:

conductorizing the IGZO film layer.

According to an aspect of the present disclosure, there is provided a display panel, including:

the array substrate according to any of the above embodiments.

According to an aspect of the present disclosure, there is provided a display device, including:

the display panel according to any of the above embodiments.

BRIEF DESCRIPTION OF THE DRAWINGS

The above and other features and advantages of the present disclosure will become more apparent from the detailed description of the exemplary embodiments with reference to the accompanying drawings.

DETAILED DESCRIPTION

Figure 1:
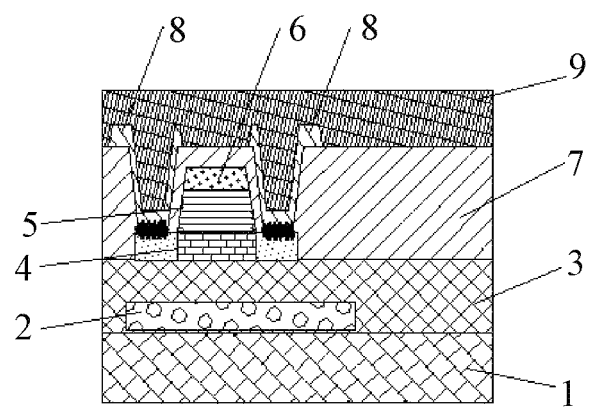
FIG. 1 is a schematic structural view of an exemplary embodiment of an array substrate of the present disclosure.

Example embodiments will now be described more fully with reference to the accompanying drawings. However, the example embodiments can be embodied in a variety of forms and should not be construed as being limited to the embodiments set forth herein; rather, these embodiments are provided so that the present disclosure would be thorough and complete, and the concept of the exemplary embodiments are fully conveyed to those skilled in the art. The same reference numbers in the drawings denote the same or similar structures, and thus their detailed description will be omitted.

The present disclosure provides an array substrate that may include an IGZO film layer 4, a gate layer 6, and a gate insulating layer 5. The gate layer 6 is provided with broken lines at a position thereof overlapping the IGZO film layer 4 to form a first gate line 61 and a second gate line 62. The gate insulating layer 5 is disposed between the IGZO film layer 4 and the gate layer 6, and is provided with at least two through holes 11 thereon. The first gate line 61 is connected with the IGZO film layer 4 through at least one through hole, and the second gate line 62 is connected with the IGZO film layer 4 through another at least one through hole.

The array substrate of the present disclosure will be described in detail below by means of the following exemplary embodiments.

In an embodiment, the thin film transistor in the array substrate is of a top gate type. The array substrate may include a substrate 1, a light shielding layer 2, a buffer layer 3, an IGZO film layer 4, a gate insulating layer 5, a gate layer 6, an interlayer insulating layer 7, a source/drain layer 8, and a pixel electrode layer 10.

Referring to the schematic structural view of an example embodiment of the array substrate shown in FIG. 1, specifically, the light shielding layer 2 may be disposed over the substrate 1 and have a material of metal molybdenum. The buffer layer 3 may be disposed over the light shielding layer 2 and the substrate 1, and have a thickness approximately greater than or equal to 300 nm and less than or equal to 500 nm. The material of the buffer layer 3 may be SiOx.

Figure 2:
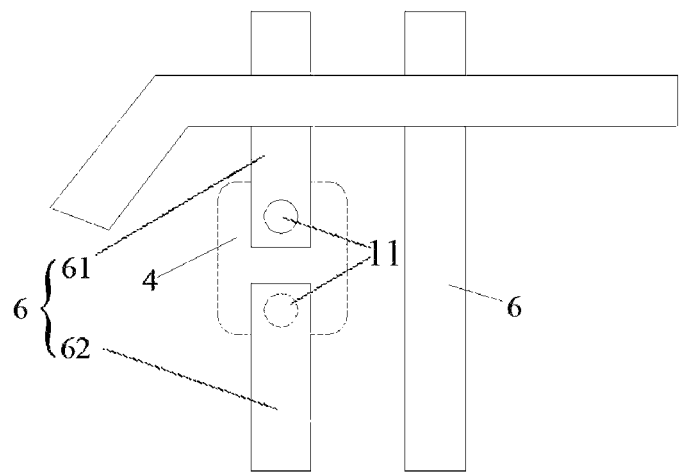
FIG. 2 is a schematic structural top view after the gate layer is formed in FIG. 1.

The IGZO film layer 4 may be disposed over the buffer layer 3 and have a thickness approximately greater than or equal to 10 nm and less than or equal to 80 nm. The IGZO film layer 4 serves as an active layer. Referring to FIG. 2, a schematic structural top view of the array substrate of FIG. 1 is shown, in which the gate layer is formed. The gate insulating layer 5 may be disposed over the IGZO film layer 4, and have a thickness approximately greater than or equal to 100 nm and less than or equal to 200 nm. The material of the gate insulating layer 5 may be SiOx. Two through holes 11 communicated to the IGZO film layer 4 may be formed on the gate insulating layer 5 by an etching process. The gate layer 6 may be disposed over the gate insulating layer 5 and have a thickness of about 400 nm. The material of the gate layer 6 may be copper. The formed gate layer 6 may be connected with the IGZO film layer 4 through the through hole, and be provided with broken lines by a lithography and etching process so as to form a first gate line 61 and a second gate line 62. The line-broken position may be located between the two through holes 11, so that the first gate line 61 may be formed to be connected with the IGZO film layer 4 through one of the through holes 11, and the second gate line 62 may be formed to be connected with the IGZO film layer 4 through another through hole. Thus, the IGZO film layer 4 may be connected in series into the gate layer 6. The gate layer 6 is energized after the conductorizing process of the IGZO film layer 4 is completed, and the conductorizing process of the IGZO film layer 4 would be successful if it is conductive, and the conductorizing process of the IGZO film layer 4 would fail if it is not conductive, so that it is not necessary to carry out next processes so as to save manpower and physical resources. In this step, the unqualified products have been detected, and the product pass rate would be improved after all of processes are completed. The IGZO film layer 4 may also be subject to a conductorizing process and then detected again.

In addition, the number of the through holes may also be provided as three, four, or more, and the through holes may be symmetrically or asymmetrically arranged, as long as the through holes are provided on both sides of the broken line.

The interlayer insulating layer 7 may be disposed over the gate layer 6 and the buffer layer 3, and have a thickness approximately greater than or equal to 300 nm and less than or equal to 500 nm. The material of the interlayer insulating layer 7 may be SiOx. The source/drain layer 8 may be disposed over the interlayer insulating layer 7, and have a thickness approximately greater than or equal to 400 nm and less than or equal to 600 nm. The material of the source/drain layer may be copper. A passivation layer 9 may be disposed over the source/drain layer 8, and have a thickness approximately greater than or equal to 200 nm and less than or equal to 400 nm. The material of the passivation layer 9 may be SiOx or SiNx. The pixel electrode layer may be disposed over the passivation layer, and have a thickness approximately greater than or equal to 10 nm and less than or equal to 80 nm. The material of the pixel electrode layer 10 may be indium gallium zinc oxide.

In another embodiment, the thin film transistor in the array substrate is of a bottom gate type. The array substrate may include a substrate 1, a gate layer 6, a gate insulating layer 5, an IGZO film layer 4, a source/drain layer 8, and the like.

Figure 3:
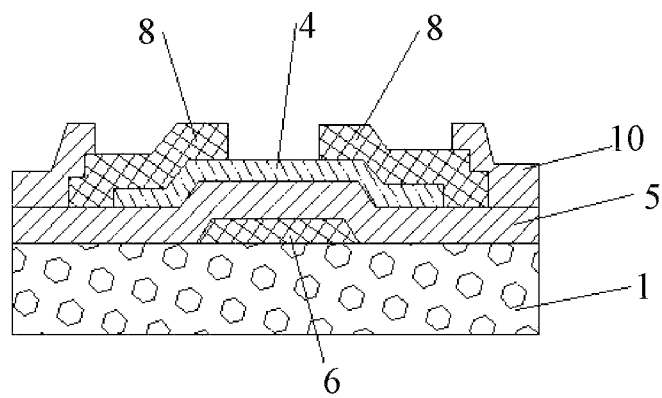
FIG. 3 is a schematic structural view of another exemplary embodiment of an array substrate of the present disclosure.
Figure 4:
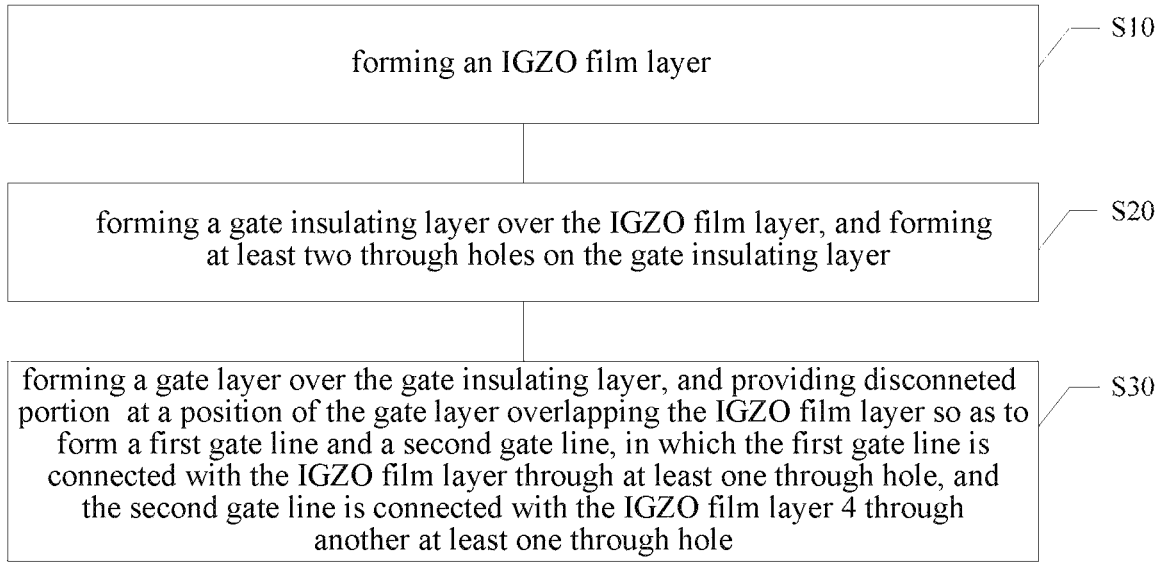
FIG. 4 is a schematic flow block diagram of an exemplary embodiment of a fabricating method of an array substrate of the present disclosure.

Referring to the schematic structural view of another exemplary embodiment of the array substrate shown in FIG. 3, specifically, the gate layer 6 may be disposed over the substrate, and the gate layer 6 may be provided with broken lines by a lithography and etching process to form a first gate line 61 and a second gate line 62. The gate insulating layer 5 may be disposed over the gate layer 6. Two through holes 11 communicated to the gate layer 6 may be formed on the gate insulating layer 5 by an etching process, where the first through hole is communicated to the first gate line 61, and the second through hole is communicated to the second gate line 62, i.e., the two through holes 11 are located on both sides of the broken line. The IGZO film layer 4 may be disposed over the gate insulating layer 5, connected with the first gate line 61 through the first through hole, and connected with the second gate line 62 through the second through hole, which may also enable the IGZO film layer 4 to be connected in series into the gate layer 6. The gate layer 6 is energized after the conductorizing process of the IGZO film layer 4 is completed, the conductorizing process of the IGZO film layer 4 is successful if it is conducted, and the conductorizing process of the IGZO film layer 4 would fail if it is not conductive, so that it is not necessary to carry out next processes so as to save manpower and physical resources. In this step, the unqualified products have been detected, and the product pass rate would be improved after all of processes are completed. The source/drain layer 8 may be disposed over the IGZO film layer 4. In the example embodiment, the number of the through holes may also be provided as three, four, or more, and the through holes may be symmetrically or asymmetrically arranged, as long as the through holes are provided on both sides of the broken line.

Further, the present disclosure further provides a fabricating method of an array substrate. Referring to a schematic flow block diagram of an exemplary embodiment of a fabricating method of an array substrate, the fabricating method of the array substrate may include the following steps:

Step S10: forming an IGZO film layer 4;

Step S20: forming a gate insulating layer 5 over the IGZO film layer 4, and forming at least two through holes on the gate insulating layer 5.

Step S30: forming a gate layer 6 over the gate insulating layer 5, and providing broken lines at a position of the gate layer 6 overlapping the IGZO film layer 4 so as to form a first gate line 61 and a second gate line 62, in which the first gate line 61 is connected with the IGZO film layer 4 through at least one through hole, and the second gate line 62 is connected with the IGZO film layer 4 through another at least one through hole.

The specific fabricating method of the array substrate is as follows:

A light shielding layer 2 may be formed by depositing molybdenum having a thickness approximately greater than or equal to 10 nm and less than or equal to 80 nm by a sputtering process, and may be processed by lithography and etching as needed.

SiOx having a thickness approximately greater than or equal to 300 nm and less than or equal to 500 nm may be deposited as a buffer layer 3 by plasma enhanced chemical vapor deposition.

An IGZO film layer 4 having a thickness approximately greater than or equal to 10 nm and less than or equal to 80 nm may be deposited as an active layer by a sputtering process, and may be processed by lithography and etching to form a desired shape as needed.

SiOx having a thickness approximately greater than or equal to 100 nm and less than or equal to 200 nm may be deposited as a gate insulating layer 5 by plasma enhanced chemical vapor deposition; patterning may be performed as needed, and at least two through holes may be formed. Then, the IGZO film layer 4 is subjected to a conductorizing process, i.e., the IGZO film layer 4 is bombarded by He plasma to be conductorized.

A gate layer 6 having a thickness of about 400 nm may be formed by a sputtering process, and may be processed by lithography and etching according to a desired pattern, so as to provide broken lines at a position thereof overlapping the IGZO film layer 4 to form a first gate line 61 and a second gate line 62, in which the first gate line 61 is connected with the IGZO film layer 4 through at least one through hole, and the second gate line 62 is connected with the IGZO film layer 4 through another at least one through hole.

SiOx having a thickness approximately greater than or equal to 300 nm and less than or equal to 500 nm may be deposited as an interlayer insulating layer 7 by plasma enhanced chemical vapor deposition, and may be patterned as needed.

A source/drain layer 8 having a thickness approximately greater than or equal to 400 nm and less than or equal to 600 nm may be formed by a sputtering process, and may be processed by lithography and etching according to a desired pattern.

SiOx or SiNx having a thickness approximately greater than or equal to 200 nm and less than or equal to 400 nm may be deposited as a passivation layer by plasma enhanced chemical vapor deposition, and may be patterned as needed.

IGZO having a thickness approximately greater than or equal to 10 nm and less than or equal to 80 nm may be deposited as a pixel electrode layer by a sputtering process, and may be processed by lithography and etching as needed.

Figure 5:
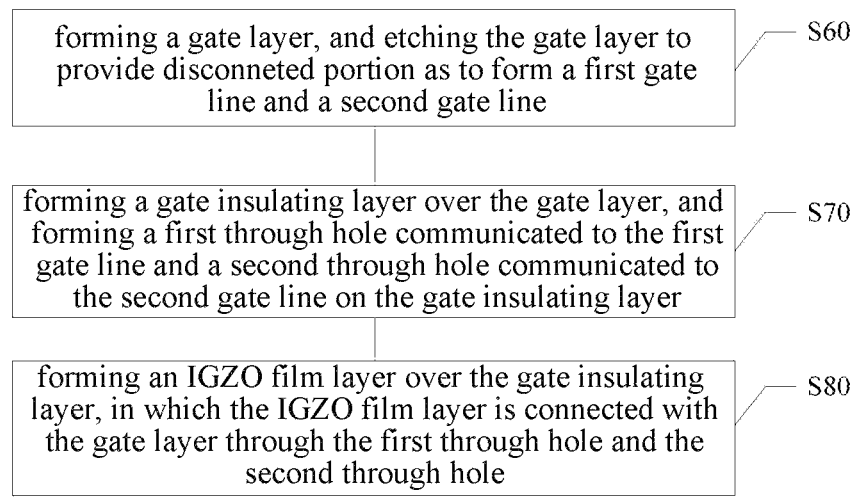
FIG. 5 is a schematic flow block diagram of another exemplary embodiment of a fabricating method of an array substrate of the present disclosure.

Further, the present disclosure further provides a fabricating method of an array substrate. Referring to a schematic flow block diagram of another exemplary embodiment of a fabricating method of an array substrate shown in FIG. 5, the fabricating method of the array substrate may include the following steps:

Step S60: forming a gate layer 6, and etching the gate layer 6 to provide broken lines so as to form a first gate line 61 and a second gate line 62;

Step S70: forming a gate insulating layer 5 over the gate layer 6, and forming a first through hole communicated to the first gate line 61 and a second through hole communicated to the second gate line 62 on the gate insulating layer 5;

Step S80: forming an IGZO film layer 4 over the gate insulating layer 5, in which the IGZO film layer 4 is connected with the gate layer 6 through the first through hole and the second through hole.

In the present exemplary embodiment, the IGZO film layer 4 is subjected to a conductorizing process after the IGZO film layer 4 is formed.

The fabrication method of the array substrate has been described in detail in the above example embodiment of the array substrate, and therefore, details thereof would not be repeated herein.

The present disclosure further provides a display panel, which may include the array substrate described above. The specific structure of the array substrate has been described in detail in the above description of the array substrate, and therefore, details thereof are not repeated herein.

Further, the present disclosure further provides a display device, which may include the above display panel, and the display panel includes the above array substrate. The specific structure of the array substrate has been described in detail in the above description of the array substrate, and therefore, details thereof would not be repeated herein.

As can be seen from the above technical solutions, the present disclosure has at least one of the following advantages and positive effects:

In the array substrate and the fabricating method of the array substrate of the present disclosure, a gate layer is provided with broken lines so as to form a first gate line and a second gate line; at least two through holes are provided on a gate insulating layer, in which the first gate line is connected with the IGZO film layer through at least one through hole, and the second gate line is connected with the IGZO film layer through another at least one through hole, thus the IGZO film layer may be connected in series into the gate layer. The gate layer is energized after the conductorizing process of the IGZO film layer is completed, and then the conductorizing process of the IGZO film layer is successful if it is conductive, and the conductorizing process of the IGZO film layer fails if it is not conductive, so that it is not necessary to carry out next processes so as to save manpower and physical resources. Also, it can improve the uniformity of conductorizition. In this step, the unqualified products have been detected, and the product pass rate would be improved after all of processes are completed.

The features, structures, or characteristics described above may be combined in any suitable manner in one or more embodiments, and the features discussed in the various embodiments are interchangeable, if possible. In the description above, numerous specific details are provided in order to fully understand the embodiments of the present disclosure. However, those skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

The phrase "about" or "approximately" as used in this specification generally refers to be a given value or a range within 20%, preferably within 10%, and more preferably within 5%. The numerical value given herein is an approximate value, i.e., meaning that a meaning of "about", "probably", "approximately" and "substantially" may be implied, unless otherwise specified.

Although the relative terms such as "on", "below", "upper" and "lower" are used in the specification to describe the relative relationship of one component to another component, these terms are used in this specification for convenience only, for example, a direction in the example according to the accompanying drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

In the present specification, the terms such as "a", "an", "the" and "said" are used to indicate the presence of one or more elements/components; the terms "comprise", "include", "have", "contain" and their variants are used to be open-type and are meant to include additional elements/components, etc., in addition to the listed elements/components/etc.; the terms "first", "second", etc. are used only as marks, rather than limitation for the number of objects.

It should be understood that the present disclosure does not limit its application to the detailed structure and arrangement of the components presented in the specification. The present disclosure may have other embodiments and may be implemented and performed in various ways. The foregoing variations and modifications are intended to fall within the scope of the present disclosure. It should be understood that the present disclosure disclosed and defined herein is extended to all alternative combinations of two or more individual features that are mentioned or apparent in the drawings. All of these different combinations constitute a number of alternative aspects of the present disclosure. The embodiments described in the specification illustrate the best mode of the present disclosure, and will enable those skilled in the art to utilize the present disclosure.

What is claimed is:

1. A system, comprising:
    an array substrate, comprising:
        an indium gallium zinc oxide (IGZO) film layer;
        a gate layer with a disconnected portion at a position thereof overlapping the IGZO film layer to form a first gate line and a second gate line, the first gate line and the second gate line being configured to detect conductorization of indium gallium zinc oxide; and
        a gate insulating layer disposed between the IGZO film layer and the gate layer, and provided with at least two through holes thereon, wherein the disconnected portion is between the at least two through holes, the first gate line is connected with the IGZO film layer through at least one through hole, and the second gate line is connected with the IGZO film layer through another at least one through hole such that the IGZO film layer is connected in series with the gate layer.

2. The system according to claim 1, wherein the IGZO film layer is disposed under the gate insulating layer, and the gate layer is disposed over the gate insulating layer.

3. The system of claim 2, wherein the array substrate further comprises:
    a substrate;
    a light shielding layer disposed over the substrate;
    a buffer layer disposed over the light shielding layer and the substrate, the IGZO film layer being disposed on the buffer layer;
    an interlayer insulating layer disposed over the gate layer and the buffer layer;
    a source/drain layer disposed over the interlayer insulating layer;
    a passivation layer disposed over the source/drain layer; and
    a pixel electrode layer disposed over the passivation layer.

4. The system according to claim 1, wherein the IGZO film layer is disposed over the gate insulating layer, and the gate layer is disposed under the gate insulating layer.

5. The system according to claim 1, further comprising: a display panel, wherein the display panel comprises the array substrate.

6. The system according to claim 5, wherein the IGZO film layer is disposed under the gate insulating layer, and the gate layer is disposed over the gate insulating layer.

7. The system according to claim 6, wherein the array substrate further comprises:
    a substrate;
    a light shielding layer disposed over the substrate;

a buffer layer disposed over the light shielding layer and the substrate, the IGZO film layer being disposed on the buffer layer;

an interlayer insulating layer disposed over the gate layer and the buffer layer;

a source/drain layer disposed over the interlayer insulating layer;

a passivation layer disposed over the source/drain layer; and a pixel electrode layer disposed over the passivation layer.

8. The system according to claim 5, wherein the IGZO film layer is disposed over the gate insulating layer, and the gate layer is disposed under the gate insulating layer.

9. The system according to claim 5, further comprising: a display device, wherein the display device comprises the display panel.

10. The system according to claim 9, wherein the IGZO film layer is disposed under the gate insulating layer, and the gate layer is disposed over the gate insulating layer.

11. The system according to claim 10, wherein the array substrate further comprises:

a substrate;

a light shielding layer disposed over the substrate;

a buffer layer disposed over the light shielding layer and the substrate, the IGZO film layer being disposed on the buffer layer;

an interlayer insulating layer disposed over the gate layer and the buffer layer;

a source/drain layer disposed over the interlayer insulating layer;

a passivation layer disposed over the source/drain layer; and a pixel electrode layer disposed over the passivation layer.

12. The system according to claim 9, wherein the IGZO film layer is disposed over the gate insulating layer, and the gate layer is disposed under the gate insulating layer.

\* \* \* \* \*